United States Patent [19]

Dubois

[11] 4,451,328

[45] May 29, 1984

[54] MANUFACTURING TASI-POLYSILICON CONDUCTORS HAVING HIGH-RESISTANCE ELEMENTS BY A LIFTOFF TECHNIQUE

[75] Inventor: Guy Dubois, Grenoble, France

[73] Assignee: Societe pour l'Etude et la Fabrication de Circuits Integres Speciaux - E.F.C.I.S., Grenoble, France

[21] Appl. No.: 423,722

[22] Filed: Sep. 27, 1982

[30] Foreign Application Priority Data

Oct. 27, 1981 [FR] France ................................. 81 20165

[51] Int. Cl.³ ..................... H01L 21/22; H01L 21/308
[52] U.S. Cl. ....................................... 156/656; 29/578; 29/591; 156/657; 156/659.1; 156/662; 156/668; 357/51; 357/59; 357/67; 357/71; 430/314; 430/315
[58] Field of Search ............... 156/653, 656, 657, 662, 156/668, 659.1; 357/51, 59, 67 S, 71; 29/578, 591; 430/314, 315

[56] References Cited

U.S. PATENT DOCUMENTS

| 4,214,917 | 7/1980 | Clark et al. | 156/657 |
| 4,265,685 | 5/1981 | Seki | 156/657 |
| 4,267,558 | 5/1981 | Guterman | 357/51 |
| 4,291,328 | 9/1981 | Lien et al. | 357/51 |
| 4,297,721 | 10/1981 | McKenny et al. | 357/51 |
| 4,332,839 | 6/1982 | Levinstein et al. | 156/657 |
| 4,362,597 | 12/1982 | Fraser et al. | 156/657 |

FOREIGN PATENT DOCUMENTS 2269199 11/1975 France .

OTHER PUBLICATIONS

Lloyd et al., "Polysilicon . . . Fabrication", IBM Technical Disclosure Bulletin, vol. 23, No. 7A, (12/80), pp. 2811-2812.
Rideout, "Method . . . Lines", IBM Technical Disclosure Bulletin, vol. 23, No. 6, (11/80), pp. 2563-2566.

Primary Examiner—Jerome W. Massie
Attorney, Agent, or Firm—Cushman, Darby & Cushman

[57] ABSTRACT

A process for manufacturing high-resistance elements for integrated circuits, in which the resistors are positioned on a layer of silica covering an integrated circuit, in a polycrystalline silicon zone possessing high resistivity, current supply lines being formed of a layer of polycrystalline silicon possessing low resistivity, surmounted by a layer of tantalum silicide. Plugs of photosensitive resin, deposited on a layer of polycrystalline silicon, are used to mark out a zone where the resistor is to be positioned, from zones in which resistivity is reduced by doping, and also to "lift-off" the layer of tantalum silicide on top of the resistor position.

3 Claims, 6 Drawing Figures

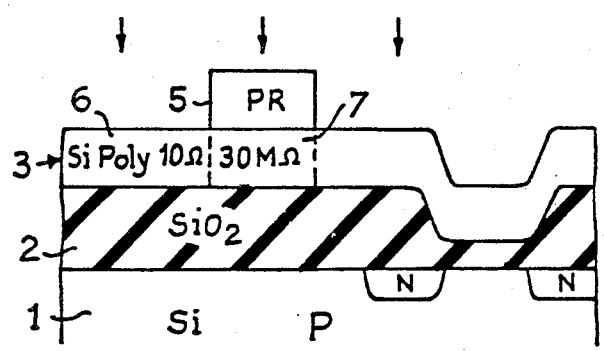
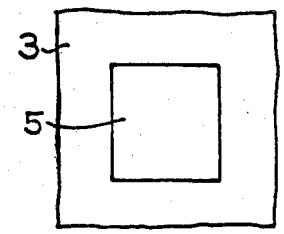
Fig. 1A
Fig. 1B
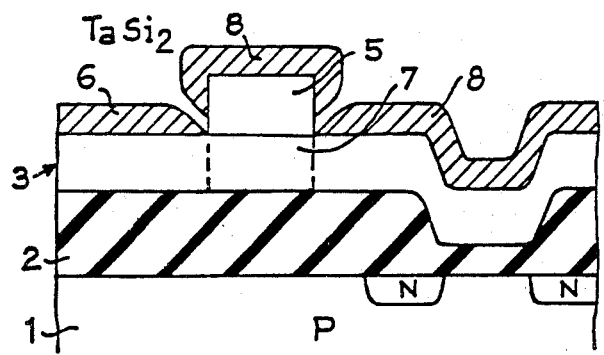
Fig. 2A
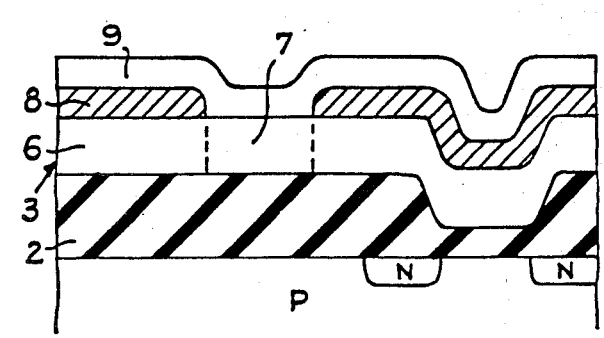
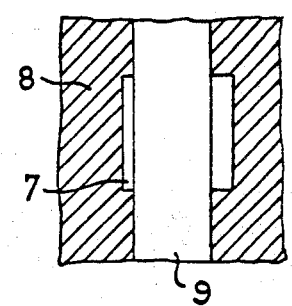
Fig. 3A
Fig. 3B
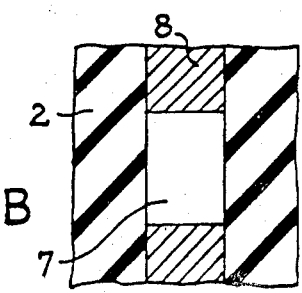
Fig. 4B

MANUFACTURING TASI-POLYSILICON CONDUCTORS HAVING HIGH-RESISTANCE ELEMENTS BY A LIFTOFF TECHNIQUE

This invention concerns a process for manufacturing high-resistance elements as part of a production procedure for MOS-type integrated circuits (metal-oxide-semiconductor), in which supply lines to certain elementary transistor terminals (gate, drain and/or source) are formed of conducting strips obtained by superimposing a strip of strongly doped polycrystalline silicon and a strip of metal silicide.

Many processes exist in the prior art to obtain high-resistance elements on MOS integrated circuits. More specifically, such processes are used to form resistors in polycrystalline silicon strips, at points possessing high resistivity, while resistivity in the rest of the strip is low, in order to ensure good conduction and current flow.

However, all such processes involve one or more of the following disadvantages:

incompatibility with a process in which the conducting strips providing access to certain elementary MOS transistor terminals (usually the gates) are formed by superimposing a strip of conducting polycrystalline silicon and a strip of metal silicide such as tantalum silicide $TaSi_2$;

need to use at least three successive masks, which is against the current trend to reduce the number of masking operations for integrated circuits, in order to avoid the problems of reciprocal alignment of successive masks, and thereby allow miniaturization;

use of technologies that are notoriously diffcult to apply, because, for example, they cannot be followed by annealing, or else require complicated selective chemical treatments, for example etching of strongly doped polycrystalline silicon selectively in relation to silicon nitride.

Consequently, one purpose of this invention is to provide a process of manufacturing high-resistance elements as part of an MOS integrated circuit production procedure, in which supply lines to certain elementary transistor terminals are formed of conducting strips, obtained by superimposing a strip of strongly doped polycrystalline silicon and a strip of metal silicide; such a process avoids the three disadvantages of the conventional processes. In other words, this new process is compatible with polycrystalline silicon/metal silicide technology, requires only two masks to make the resistors, and does not involve any complicated selective etching operations.

In this process, resistors are positioned above the surface of the semiconductor containing the integrated circuit, on a thick oxide layer. The process comprises the following steps: depositing a layer of polycrystalline silicon possessing high resistivity on the semiconductor; formation, by deposit and masking, at points where resistors are to be located, of plugs of a photosensitive substance; doping the polycrystalline silicon, in order to endow it with low resistivity, except at points protected by the plugs of photosensitive substance; depositing a layer of metal silicide on the semiconductor; removal by chemical etching of the plugs and portions of silicide covering, using the "lift-off" technique; and masking the surface of the semiconductor and etching the silicide and polycrystalline silicon, to form lines, some at least of which pass over the plug positions. The metal silicide may be tantalun silicide $TaSi_2$, and the order of performance of the final two stages may be reversed.

Further features and advantages of the invention will emerge from the following description of one specific embodiment, with reference to the accompanying figures:

FIGS. 1A, 2A and 3A, showing cross-sectional views of successive stages of production of resistors using this new process;

FIGS. 1B, 3B and 4B, showing overhead views of successive production stages.

In accordance with current conventions in illustrating semiconductors, these figures are not drawn to scale, and relative thicknesses and distances between various layers have been modified for greater clarity. Those skilled in the art will make use of standard skills in this field, or the specific information given below. Identical references are used for similar components or layers.

FIG. 1A shows an intermediate stage in the manufacture of a resistor as described in this invention. An insulating layer 2 of silicon dioxide, or silica which varies in thickness in different places, is deposited on a semiconducting surface 1, normally silicon. The left-hand part of the figure shows a zone where the silica layer is thick, and above which the resistor is to be positioned. The right-hand side shows a zone where the silica layer is thinner; this corresponds to the gate of a MOS field-type transistor. In the stage illustrated in FIG.1A, the surface is coated uniformly with a layer 3 of polycrystalline silicon, possessing a high level of resistance (e.g. 30 megohms/square). This resistance is obtained in situ when the layer of polycrystalline silicon is being deposited, or by subsequent doping, achieved by diffusion or implantation. The layer of polycrystalline silicon is first covered with a uniform layer of a photosensitive resin (PR), then a masking and etching phase is carried out, so that only plugs 5 of resin are left at the points where resistors are required.

This is followed by implantation of a doping agent, to increase the conductivity of the polycrystalline silicon at places not protected by the resin plugs 5. This produces zones 6 where the polycrystalline silicon possesses low resistivity (approximately 10 ohms/square), and other zones 7 situated beneath the resin plugs 5, where it retains its original resistivity (i.e. approximately 30 megohms/square).

As shown in FIG. 2A, a uniform layer of metal silicide, such as tantalum silicide $TaSi_2$, is then deposited. The resin is selectively etched, to remove the plug 5 together with the portion of tantalum silicide on top of it, producing the structure shown in cross section in FIG. 3A and from above in FIG. 3B.

The surface is next masked with strips 9 of resin, then etched to cut strips in the tantalum silicide 8 and underlying polycrystalline silicon layer 4. Chemical agents are currently available that will selectively etch tantalum silicide 8 and polycrystalline silicon 3, in relation to silica 2 and resin 9 (e.g. dry etching with a pure or chlorinated fluoro-plasma). This type of selective etching is quite simple to perform; whereas, for example, etching of a highly conducting polycrystalline silicon layer, while remaining selective in relation to a silicon nitride layer, would have been much more difficult. This operation results in a resistor, as illustrated in the overhead view in FIG. 4B, the longitudinal dimension of which is governed by the resin plug 5, and the transverse dimensions by the width of the resin strip 9.

This new process comprises only two masking stages, i.e. the plug formation stage illustrated in FIGS. 1A and 1B, and the tantalum silicide and polycrystalline silicon-cutting stage illustrated in FIGS. 3B and 4B, thereby ensuring resistant elements of minimum size. In addition, there is no need for strict alignment of these two masking stages: as shown in FIG. 3B; slight misalignment between the plug mask and the strip mask does not detract from the result, as long as the plugs are sightly wider than the strips.

It is also possible to lift off the resin plug 5 and tantalum silicide covering it only after strip etching of the tantalum silicide and polycrystalline silicon.

This invention is in no way confined to the embodiments explicitly described above: it also covers variants and generalizations contained in the claims below.

What is claimed is:

1. A process for manufacturing high-resistance elements as part of an integrated circuit production procedure, in which access lines to certain elementary transistor terminals are formed of conducting strips, obtained by superimposing a strip of strongly doped polycrystalline silicon and a strip of metal silicide, such resistors being positioned at places where the integrated circuit surface is coated with a thick layer of oxide, said process comprising the following steps:

depositing on an oxide coated integrated circuit surface a layer of polycrystalline silicon possessing high resistivity;

depositing on said polycrystalline silicon layer at places where resistors are required plugs of photosensitive substance;

doping the polycrystalline silicon to endow it with low resistivity except at places protected by said photosensitive substance;

depositing a silicide over the entire surface of the integrated circuit including the unmasked polycrystalline silicon and the plugs;

removing by chemical lift-off the photosensitive plugs and portions of silicide covering them;

selectively masking and etching said silicide and polycrystalline silicon to form said lines, some at least of which pass over the plug positions.

2. A process as defined in claim 1, in which the metal silicide is tantalum silicide.

3. A process as defined in claim 1, in which said step of masking and etching precedes said step of removing.

* * * * *